United States Patent
Ramamurti et al.

(10) Patent No.: US 7,324,392 B2
(45) Date of Patent: Jan. 29, 2008

(54) ROM-BASED MEMORY TESTING

(75) Inventors: Ananthakrishnan Ramamurti, Irvine, CA (US); Raguram Damodaran, Plano, TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 11/422,726

(22) Filed: Jun. 7, 2006

(65) Prior Publication Data

US 2007/0033469 A1 Feb. 8, 2007

Related U.S. Application Data

(60) Provisional application No. 60/688,972, filed on Jun. 9, 2005.

(51) Int. Cl.
*G11C 7/00* (2006.01)
*G11C 29/00* (2006.01)
*G06F 11/00* (2006.01)
*G01R 31/28* (2006.01)

(52) U.S. Cl. ............... 365/201; 714/30; 714/702; 714/715; 714/720; 714/733

(58) Field of Classification Search .......... 714/25, 714/30, 702, 715, 718, 719, 720, 733, 703; 365/201

See application file for complete search history.

(56) References Cited

U.S. PATENT DOCUMENTS

| | | | |
|---|---|---|---|
| 5,936,900 A * | 8/1999 | Hii et al. | 365/201 |
| 6,353,563 B1 * | 3/2002 | Hii et al. | 365/201 |
| 6,643,807 B1 * | 11/2003 | Heaslip et al. | 714/719 |
| 2003/0167431 A1 * | 9/2003 | Nicolaidis et al. | 714/733 |
| 2003/0212940 A1 * | 11/2003 | Wong | 714/725 |
| 2004/0006729 A1 * | 1/2004 | Pendurkar | 714/733 |
| 2004/0107396 A1 * | 6/2004 | Barone et al. | 714/733 |
| 2004/0123192 A1 * | 6/2004 | Caty et al. | 714/718 |
| 2004/0158786 A1 * | 8/2004 | Caty et al. | 714/733 |
| 2005/0204231 A1 * | 9/2005 | Mukherjee et al. | 714/733 |

* cited by examiner

*Primary Examiner*—Ly Duy Pham
(74) *Attorney, Agent, or Firm*—Robert D. Marshall, Jr.; W. James Brady; Frederick J. Telecky, Jr.

(57) ABSTRACT

This invention uniquely partitions the pBIST ROM for storing program and data information. The pBIST unit selectively loads both the algorithm and data, the algorithm only or the data only for each test set stored in the pBIST ROM into read/write registers. These registers are memory mapped readable/writable. A configuration register has an algorithm bit and a data bit which determines whether the corresponding algorithm or data is loaded from the pBIST ROM. The pBIST unit includes another configuration register having one bit corresponding to each possible test set stored in the pBIST ROM. The pBIST unit runs a test set if the corresponding bit in the configuration register has a first digital state.

5 Claims, 4 Drawing Sheets

| ROM LOCATION | ROM DATA BITS [31:0] |
|---|---|
| 501 | RF0L DATA |
| 502 | RF1L DATA |
| ⋮ | ⋮ |
| 515 | RF14L DATA |
| 516 | RF15L DATA |
| 520 | RF0U DATA |
|  | RF1U DATA |
| ⋮ | ⋮ |
| 531 | RF14U DATA |
| 532 | RF15U DATA |
| 541 | RAM GROUP MASK BITS [31:0] |
| 542 | RAM GROUP MASK BITS [63:32] |
| 551 | 1st D1:D0 |
| 552 | 1st E1:E0 |
| 561 | 2nd D1:D0 |
| 562 | 2nd E1:E0 |
| ⋮ | ⋮ |
| 591 | 14th D1:D0 |
| 592 | 14th E1:E0 |

FIG. 4

| ROM LOCATION | ROM BITS [31:0] | | | | | | |
|---|---|---|---|---|---|---|---|
| 0000 | ALGORITHM START ADDRESS [31:20] (0x0023, FOR INSTANCE) | | | | | DON'T CARE [19:0] | |
| 0001 | RAM START ADDRESS [31:20] (0x0058, FOR EXAMPLE) | | | | | DON'T CARE [19:0] | |
| ∘∘∘ | ∘∘∘ | | | | | | |
| 0023 | SIZE 1 [31:26] | V [25] | R [24] | I [23] | M [22] | C [21] | DON'T CARE [20:6] | ALGO ID [5:0] |
| | ALGORITHM 1 INFORMATION | | | | | | |
| ALGO 2 START | SIZE 2 [31:26] | V [25] | R [24] | I [23] | M [22] | C [21] | DON'T CARE [20:6] | ALGO ID [5:0] |
| | ALGORITHM 2 INFORMATION | | | | | | |
| ∘∘∘ | ∘∘∘ | | | | | | |
| ALGO M START | SIZE M [31:26] | V [25] | R [24] | I [23] | M [22] | C [21] | DON'T CARE [20:6] | ALGO ID [5:0] |
| | ALGORITHM M INFORMATION | | | | | | |
| ∘∘∘ | ∘∘∘ | | | | | | |
| 0058 | SIZE 1 [31:24] | V [23] | | | | DON'T CARE [22:0] | |
| | RAM 0 INFORMATION (8 WORDS) | | | | | | |
| ∘∘ | ∘∘ | | | | | | |
| | RAM 30 INFORMATION (8 WORDS) | | | | | | |
| ∘∘∘ | SIZE 2 [31:24] | V [23] | | | | DON'T CARE [22:0] | |
| | RAM 0 INFORMATION (8 WORDS) | | | | | | |
| ∘∘ | ∘∘ | | | | | | |
| | RAM 30 INFORMATION (8 WORDS) | | | | | | |
| ∘∘∘ | ∘∘∘ | | | | | | |
| ∘∘∘ | SIZE 63 [31:24] | V [23] | | | | DON'T CARE [22:0] | |
| | RAM 0 INFORMATION (8 WORDS) | | | | | | |
| ∘∘ | ∘∘ | | | | | | |
| | RAM 30 INFORMATION (8 WORDS) | | | | | | |

Row labels: 401, 402, 403, 404, 405, 406, 407, 408, 409, 410, 411, 419, 420, 421, 429, 490, 491, 499

| ROM LOCATION | ROM DATA BITS [31:0] | |
|---|---|---|
| 601 | CLOCK | |
| 602 | RAMT | |
| 603 | CA1 | CA0 |
| 604 | CL1 | CL0 |
| 605 | I1 | I0 |
| 606 | CSR | |
| 607 | STR | |
| 608 | UNUSED AT THIS TIME | |
| ⋮ | ⋮ | ⋮ |
| 631 | CLOCK | |
| 632 | RAMT | |
| 633 | CA1 | CA0 |
| 634 | CL1 | CL0 |
| 635 | I1 | I0 |
| 636 | CSR | |
| 637 | STR | |
| 638 | UNUSED AT THIS TIME | |

ROM-BASED MEMORY TESTING

CLAIM OF PRIORITY

This application claims priority under 35 U.S.C. 119(e)(1) to U.S. Provisional Application No. 60/688,972 filed Jun. 9, 2005.

TECHNICAL FIELD OF THE INVENTION

The technical field of this invention is integrated circuit testing.

BACKGROUND OF THE INVENTION

Testing fabricated integrated circuits to determine proper operation has always been a difficult problem. There are two major types of errors. A design defect means that the integrated circuit was manufactured to a design not proper for the intended purpose. Such a defect will effect every integrated circuit until the design is changed. The integrated circuit manufacturer must detect and correct such defects before shipping large number of parts to customers to avoid a costly recall. A manufacturing defect involves some fault in the manufacture of the integrated circuit that will effect less than all parts manufactured. Such defects are corrected by identification and correction of the manufacturing fault.

Most integrated circuit manufacturers test integrated circuits for proper function before shipment to customers. With the increase in integrated circuit complexity this testing is increasingly difficult. Many manufacturers rather than rely on increasingly expensive external testing devices test integrated circuits using a technique called built-in self test (BIST). BIST involves using circuits manufactured on the integrated circuit to test the integrated circuit. When triggered either automatically in circuit operation or by an external test device, the BIST circuits produce a set of test conditions run on the ordinary circuit hardware. Comparison of the state of the integrated circuit following test to an expected state indicates whether the integrated circuit passed the test. An example of such a test is writing to a read/write memory and recalling the data written. A match between the data written and the data read results in passing the test. BIST typically involves other more complex tests.

A subset of BIST is programmable built-in self test (pBIST) which uses a general purpose test engine programmed by a set of instructions. This set of test instructions is typically stored on the integrated circuit in a read only memory (ROM) storing test instructions particularly developed for that integrated circuit. pBIST enables re-use of hardware and test instructions to cover a family of similar but not identical integrated circuits. pBIST typically does not have the ability to support go/no-go type of testing using an instruction ROM.

SUMMARY OF THE INVENTION

This invention uniquely partitions the pBIST ROM for storing program and data information. The pBIST unit selectively loads both the algorithm and data, the algorithm only or the data only for each test set stored in the pBIST ROM. The pBIST unit includes a plurality of test data read/write registers and a plurality of test algorithm read/write registers for storing respective test data and test algorithms from the pBIST ROM. These test data read/write registers and test algorithm read/write registers are memory mapped readable/writable. This enables loading of the test data or the test algorithm via a memory mapped write operation while the other part is loaded from the pBIST ROM.

The pBIST unit includes a configuration register having an algorithm bit and a data bit. The digital state of these bits determines whether the corresponding algorithm or data is loaded from the pBIST ROM. This configuration register is memory mapped readable/writable.

The pBIST unit includes another configuration register having one bit corresponding to each possible test set stored in the pBIST ROM. The pBIST unit runs a test set if the corresponding bit in the configuration register has a first digital state, and does not run the test set on the second digital state. This configuration register is also memory mapped readable/writable.

This invention provides lots of flexibility to test memories even while doing a complete ROM-based test. This invention provides the ability to download just the algorithm information or just the memory information from the ROM.

BRIEF DESCRIPTION OF THE DRAWINGS

These and other aspects of this invention are illustrated in the drawings, in which:

FIG. 4 illustrates an example of the coding of the programmable built-in self test read only memory illustrated in FIG. 1 according to this invention;

DETAILED DESCRIPTION OF PREFERRED EMBODIMENTS

Figure 1:
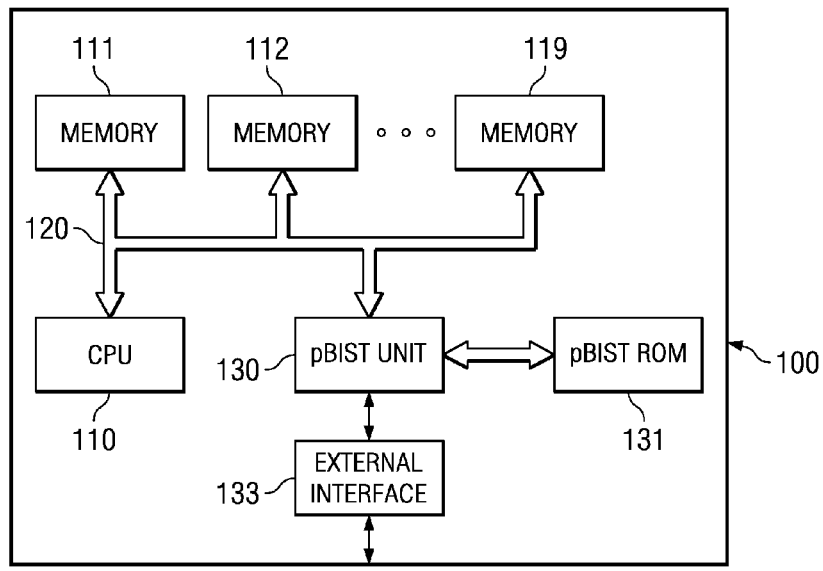
FIG. 1 is a block diagram of a typical integrated circuit including a programmable built-in self test unit (prior art)

FIG. 1 illustrates a typical integrated circuit 100 including programmable built-in self test. FIG. 1 illustrates integrated circuit 100 including central processing unit (CPU) 110 and memories 111, 112 . . . 119 coupled by bus 120. These circuits are merely representative of circuits embodied in an integrated circuit including pBIST.

The programmable built-in self test includes pBIST unit 130, pBIST ROM 131 and external interface 133. pBIST unit 130 controls the tests in much the same fashion as CPU 110 controls operation of integrated circuit 100. pBIST unit 130 is controlled by test instructions stored in pBIST ROM 131. pBIST unit 130 may couple to circuits outside integrated circuit 100 via external interface 133. FIG. 1 illustrates pBIST unit 130 coupled to CPU 110 and memories 111, 112 . . . 119 via bus 120. This connection is merely illustrative of the type of connection between pBIST unit 130 and other circuits of integrated circuit 100.

Figure 2:
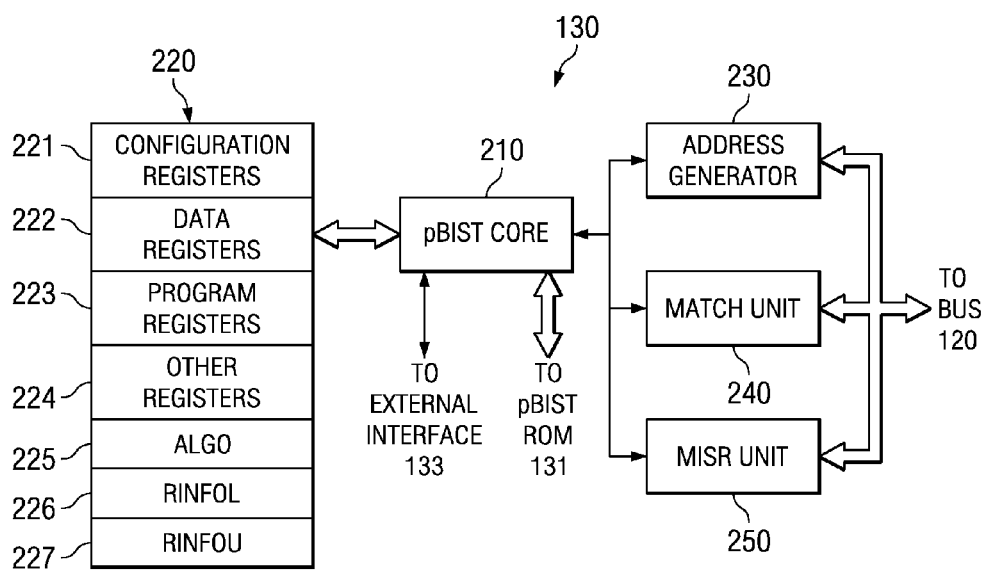
FIG. 2 is a block diagram of the programmable built-in self test unit of this invention.

FIG. 2 illustrates a more detailed view of pBIST unit 130. pBIST unit 130 includes pBIST core 210, registers 220, address generator 230, match unit 240 and MISR unit 250. pBIST core 210 is the center of pBIST unit 130. pBIST core 210 is coupled to registers 220, pBIST ROM 131, external interface 133, address generator 230, match unit 240 and MISR unit 250. Interaction of pBIST core 210 with these circuits will be further described below.

Registers 220 are preferably memory mapped within the address space of CPU 110. Thus CPU 110 can read from or write to any register within registers 220 by a memory operation to a corresponding address. Registers include configuration registers 221. Configuration registers 221 control the configuration of pBIST unit 130 and the operational mode of pBIST unit 130. Data registers 222 store test data recalled from pBIST ROM 131 in a manner more fully described below. Program registers 223 store test program instructions recalled from pBIST ROM 131 in a manner more fully described below. Other registers 224 include miscellaneous registers not fully described. Registers 220 includes three registers described in detail below: ALGO register 225; RINFOL register 226; and RINFOU 227.

The ALGO register 225 is an algorithm mask register. Bit [0] of this register indicates whether the first algorithm stored in the ROM would be executed or not. Bit [1] indicates whether the second algorithm is executed and so on. A total of 32 algorithms can be stored in the ROM as is determined by the data width of ALGO register 225. For an algorithm to be executed, both the corresponding bit of the ALGO register and a valid bit in the previous algorithm header must be set. The details of this valid bit will be further described below.

The RAM group mask registers RINFOL register 226 and RINFOU register 227 are similar to ALGO register 225. RAM group mask registers RINFOL register 226 and RINFOU register 227 indicate whether a particular RAM group is executed or not. This capability is provided because not all algorithms can be run on all memories. For a particular RAM group to be executed, the corresponding bit in RINFOL register 226 or RINFOU register 227 and the valid bit in the previous RAM group header must both be set. RINFOL register 226 indicates the validity of RAM groups 0 to 31 and RINFOU register 227 indicates the validity of RAM groups 32 to 63. These RAM groups will be further described below.

Figures 3, 5:
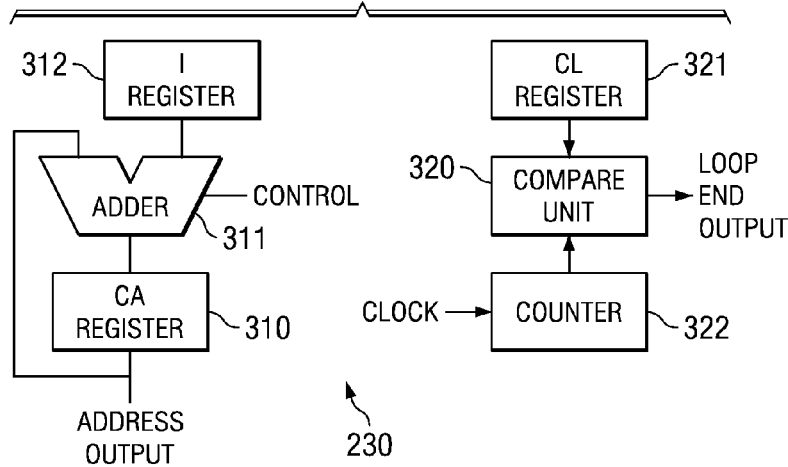
FIG. 3 is a block diagram of the address generation unit of the programmable built-in self test unit of FIG. 2.
FIG. 5 illustrates an example of the algorithm section of the programmable built-in self test read only memory illustrated in FIG. 4 according to this invention.

Address generator 230 preferrable includes two address generators used in accessing memory, such as memories 111, 112 . . . 119. FIG. 3 illustrates a block diagram of one of these address generators. Address generator 230 includes CA address register 310, adder 311, I increment register 312, compare unit 320, loop count register 321 and counter 322. In the preferred embodiment the initial values of address register CA 310, increment register 1312 and loop count register 321 are recalled from pBIST ROM 131. Adder 311 is controlled via a control input in one of three modes. In a non-increment mode, adder 311 returns an address output equal to the recycled value of CA register 310. The value of CA register 310 is thus unchanged. In an increment mode, adder 311 adds the values stored in CA register 310 and I increment register 312. The sum value is stored in CA address register 310 for the next iteration. The decement mode is similar to the increment mode, except adder 311 subtracts the value of I increment register 312 from the value of CA address register 310. The difference value is stored in CA address register 310 for the next iteration. The initial value of CL loop count register 321 sets the number of iterations in the loop. Compare unit 320 compares the value of CL loop count register 321 with the value of counter 322. Upon starting a test counter 322 is reset to zero. The count of counter 322 advances by one each cycle of the clock input. Compare unit 320 generates a loop end output when these two values match.

FIG. 4 illustrates an example of the data stored in pBIST ROM 131 according to this invention. This new organization supports a ROM interface and ROM access protocol that simplifies memory testing directly from pBIST ROM 131.

pBIST ROM 131 is divided into two regions. The first region stores algorithms and the second region stores data or memory information. ROM-based testing flow stems from pre-loading all the necessary algorithms and memory information on a ROM. All the programmer needs to do is set pBIST unit 130 in ROM mode and pBIST unit 130 takes care of the rest. pBIST unit 130 internally downloads the algorithms from pBIST ROM 131 one after the other. For every algorithm that gets downloaded, pBIST unit 130 also downloads the memory information stored in pBIST ROM 131 and runs the test on corresponding memories, such as memories 111, 112 . . . 119.

pBIST unit 130 preferably also has the capability to selectively run the algorithm only on specific RAM groups by setting a RAM group mask, downloading only the algorithm portion of the ROM, or only the memory information from the ROM. This will be described more fully below.

ROM-based testing by pBIST 130 are preferably enabled in two ways. First, a single bit signal on external interface 133 could simply be asserted. This signal would come from an external test device not shown in FIG. 1. This initiates ROM-based testing. Testing proceeds automatically until all the algorithms get executed on all the memories. This signal is deasserted to take pBIST unit 130 out of ROM mode.

Second, an internal configuration register which is part of configuration registers 220 includes a bit to start testing. In this option, writing '1' to a particular bit of this internal configuration register initiates ROM-based testing. This option can be used either when there is no access to the external signal of the first method, or when the particular application dictates the ROM-based testing be started using a different interface. Writing a '0' to this bit of the configuration register takes pBIST unit 130 out of ROM mode.

A two-bit memory-mapped ROM configuration register pbist_rom[1:0] part of configuration registers 221 determines what gets executed from pBIST ROM 131. pbist_rom[1] acts as an enable for the algorithm section of the ROM and pbist_rom[0] for the RAM data section. The default state following reset is "11". This state causes both the algorithm and memory information will be downloaded from pBIST ROM 131. Table 1 lists the various modes enabled by this register.

TABLE 1

| State | Mode |
|-------|------|
| 11 | Both algorithm and memory data are used |
| 00 | Nothing from the ROM gets used |
| 10 | Only the algorithm is used |
| 01 | Only memory data is used |

In the "10" mode, the programmer needs to set all the internal pBIST configuration registers and the memory information before enabling the ROM mode using one of the two methods described above. This mode executes each algorithm in the ROM for this corresponding memory information. In the "01" mode, the programmer needs to load the algorithm into the internal register files through an available interface. pBIST core 210 loads the memory data from pBIST ROM 131 into data registers 222 and/or loads the algorithm data from pBIST ROM 131 into program registers 223 on starting in the ROM mode.

FIG. 4 illustrates an example of how pBIST ROM 131 contents are organized. pBIST ROM 131 can hold both algorithm information and memory information. The test developer can choose to load both types of information or just one of the two by setting the appropriate bits in the memory-mapped ALGO register 225, RINFOL register 226 and RINFOU 227.

As illustrated in FIG. 4, the first two words 401 and 402 are addresses. First word 401 holds the start address for the first algorithm header 404. Second word 402 holds the stare address of the first RAM group header 410. In this example first word 401 holds the address hex 0023. Following an optional gap 403 is the algorithm section. As specified in first word 401 the algorithm section begins at address hex 0023. The respective algorithm sections include a header 404, 406 and 408 and algorithm information 405, 407 and 409. Each header 404, 406 and 408 specifies: the algorithm section size in size bits [31:26]; validity of the following algorithm in valid bit [25]; retention mode in retention bit [24]; IDDQ mode in I bit [23]; and MISR mode in MISR bit [22].

Each algorithm header valid bit that specifies the validity of the algorithm following the current one and not that of the current algorithm itself. The first algorithm is always executed provided the corresponding pbist_rom mask bit is set. In short, the valid bit marks the last algorithm. A value of '0' in the algorithm header valid bit denotes the current algorithm is the last.

There cannot be any gaps within the algorithm section. What this means is that the address location has to be continuous from the first line of the first algorithm to the last line of the last algorithm. Likewise, there cannot be any gaps within the RAM groups. It has to be continuous all the way from the first RAM group to the sixty-third RAM group. However, there could be an address gap between the algorithm section and the RAM group section and between the first 2 words and the beginning of the algorithm section.

In addition to the size and valid bits, the algorithm header 404, 406 and 408 has four bits that specify a corresponding memory testing mode. When the retention bit [24] is set, pBIST unit 103 asserts a retention signal output by external interface 133 going out. pBIST unit 130 waits to revieve a pbist_resume signal before it continues on the next algorithm.

If the IDDQ bit [23] is set, then pBIST unit 130 is set in IDDQ mode. In this mode, the instruction WRITE_IDDQ can be used to write inverted data back to the memories.

MISR bit [22] should be set mainly for testing other chip-level ROMs. However, it can also be used to test any memory using any algorithm. If this bit is set, then the return data from the memories is not compared to expected data and no failures would be triggered. The read data is fed directly into a MISR instead. The following polynomial is used by the MISR logic:

$x^{32}+x^{22}+x^2+x+1$.

The tap points are bits 31, 30 and 10. The default value at the MISR output after reset is:

hex AAAAAAAA.

At the end of the memory test, the MISR signature is compared with the expected signature in the data register D1:D0 within other registers 224 to determine whether the test is passed or failed.

Bit [21] of the algorithm header specifies the Cumulative MISR mode. This mode is different from the MISR mode in two ways. First, the MISR signature comparison with the expected signature is done after testing all the memories in a particular RAM group and not after each individual memory. Second, this mode gives the programmer the capability to initially load a background pattern in data registers D1:D0 and E1:E0 within other registers 224 for the memory testing. After the memory testing is over, this mode loads a new value into these registers in order to use as expected signature. In other words, the first D1:D0 and E1:E0 values serve as the background pattern and the second D1:D0 and E1:E0 values serve as the expected signature. Any additional values for D1:D0 and E1:E0 will be ignored. Thus in CMISR mode, only the first two pairs of D1:D0 and E1:E0 values are used.

The last 6 bits of each algorithm header bits [5:0] have a unique algorithm ID. This will help in debugging efforts to find out which algorithm caused a memory failure. The test developer can choose not to use these fields. However, these 6 bits of algorithm ID will always get scanned out as part of failure data.

There are 12 bits for the ROM address. So the maximum possible size is 4K words. How these 4K words are partitioned between the algorithms and the RAM groups is up to the test developer. Other embodiments may have greated than this address bus width to 16 bits in order to support chips with larger memories.

FIG. 5 illustrates an example of the coding of an algorithm section 405, 407 and 409. The first 32 words 501 to 532 of each algorithm section are test instructions that will be loaded into program registers 223 in pBIST unit 130. The next two words 541 and 542 set the mask for RAM groups. This is needed because not all algorithms can be run on all RAM groups. The test developer is responsible for grouping memories according to their type, etc. There could be up to 64 different RAM Info groups, and each having a maximum of 31 memories. This mask value is loaded onto an internal 64-bit register in other registers 224 in pBIST unit 130 that determines at run time which RAM groups the algorithm would get executed upon. From the preceding information, it can easily be seen that each algorithm section is at least 34 words long.

Following the algorithm and mask portions, starting at word 551 are the actual data values the algorithm needs to use. These are the background patterns for the corresponding algorithm. Data values are always downloaded in pairs into data registers 222. The first access being for 32-bit register D1:D0 and the second access for data register E1:E0. Since there might be a need to test the memories using the same algorithm for more than one background pattern, multiple data values for the same algorithm are supported. So for every pair of data that gets downloaded from pBIST ROM 131, the ROM interface logic would sweep, one at a time, all the 64 RAM groups or the total number of RAM groups actually present. After all the memories are tested with this data, the next available data pair is downloaded from pBIST ROM 131 and the RAM group sweep repeats. Once all the data values for a particular algorithm are used, the ROM controller would move onto the next algorithm. This continues until all the algorithms get executed for all the possible RAM groups.

Each algorithm's header 404, 406 and 408 carries the 6-bit size information for that particular algorithm. Thus size of an algorithm with its corresponding data can be a maximum of $2^6-1=63$ words long. Since the algorithm and the mask information take up the first 34 words, each algorithm can support up to 14 different data values for D1:D0 and E1:E0 for a total of 62 words. The 63$^{rd}$ word is not used since D1:D0 and E1:E0 are always downloaded as a pair.

After the algorithm section is the RAM group section. As noted in second word 402 the first RAM group section begins at hex 0058. Each RAM group has its own header 410, 420 and 490 specifying its size in size bits [31:24], and validity of the next RAM group in valid bit [23]. Under each RAM group is the information relating to different RAMs within that group at data words 411 to 419, 421 to 429 and 491 to 499.

Figures 6, 7:
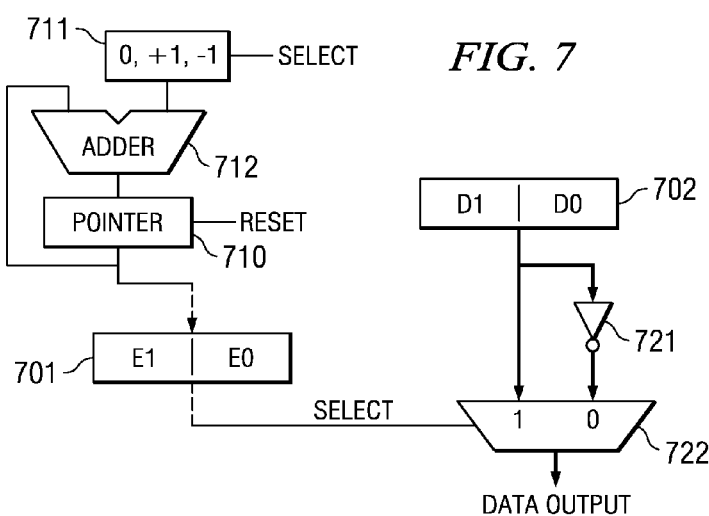
FIG. 6 illustrates an example of the memory group section of the programmable built-in self test read only memory illustrated in FIG. 4 according to this invention.
FIG. 7 illustrates an example of the pointer used in transpose instructions according to this invention.

FIG. 6 illustrates an example of the coding of a RAM group. A total of 64 RAM groups are supported. Each RAM group can hold information for up to 31 different memories. Each memory information 411 to 419, 421 to 429 and 491 to 499 is eight words. Word 601 specified clock it uses (Clock). Word 602 specifies an ID, data width and latency as part of RAMT. Word 603 specifies initialization values for the address registers CA1 and CA0 (311 in FIG. 3). Word 604 specifies initializations values for loop count registers CL1 and CL0 (321 in FIG. 5). Word 605 specifies initialization values for increment registers I1 and I0 (312 in FIG. 3). Word 605 (CSR) can enable multiple memories within a particular group can be activated at the same time. This may be useful for IDDQ leakage tests. Multiple memories would be activated but return data would be read from only one memory. Word 607 (STR) is always loaded with the value 0x1 to indicate the memory test is ready to be started. Word 608 is not used at this time. FIG. 6 illustrates word 631 to 638 for another RAM group.

Since a total of 31 different memories are supported for each RAM group, the total size of a RAM group can be a maximum of 31×8=248 words. This is denoted by the 8-bit size field [31:24] in each RAM group header. The 8-bit value indicates that only a maximum of $2^8-1=255$ words can be stored in a RAM group. Since having 32 memories in a RAM group would require 256 words, only a maximum of 31 memories per RAM group is supported.

A go/no-go mode of testing is the default mode for pBIST unit 130. This enables a direct push-button type of testing using the pBIST ROM 131. In this mode, execution stops on the first failure and both FAIL and DONE signals are asserted as outputs on external interface 133. The test does not proceed after the first failure as the main purpose of this mode is to determine just pass/fail. After detecting a failure, the test user can access pBIST unit 130 through external interface 133 or by memory mapped access to data registers 220 to get more information about the failure. However, if data logging is desired while in go/no-go mode, then a datalog_enable signal could be asserted via external interface 133 to enable logging out of failure data. In this case, execution would not stop after the first failure and would continue until all the algorithms have been executed on all the memories.

This invention includes eight new transpose instructions in addition to the already rich pBIST instruction set. These instructions can be used to effectively reduce the code space of algorithms like DTXN.

FIG. 7 illustrates an example circuit implementing the new transpose instructions. The transpose instructions make use of two 32-bit data registers D1:D0 702 and E1:E0 701 which are part of other registers 224. Pointer 710 is used to keep track of the location in data register E1:E0 701. Data from data register D1:D0 702 supplies the "1" input of multiplexer 722 and to the input of multi-bit inverter 721. The inverted data from multi-bit inverter 721 supplies the "0" input of multi-bit multiplexer 722. The bit in data register E1:E0 701 supplies the selection input of multiplexer 722. If the bit pointed to by pointer 710 is a '1', then multiplexer 722 selects the value in data register D1:D0 702 as the data for memory writes and reads. If the bit is a '0', then multiplexer 722 selects the inverse of data register D1:D0 702 from multi-bit inverter 721 as the data for memory writes and reads.

The new instructions differ in how they update pointer 710. After reset pointer 710 is always reset to bit location [0]. After the previous value of pointer 710 selects a bit within data register E1:E0 701, pointer 710 is optionally updated. The Write Transpose (WRITET) instruction does not update pointer 710. A select signal selects a '0' output from register 712. Adder 711 adds this "0" to the current value of pointer 710 and stores the unchanged value in pointer 710. The Write Transpose 0 (WRITET_0) instruction resets pointer 710 to "0" to point to bit [0] of the data register E1:E0 701. This pointer update is done after the instruction is executed. The Write Transpose Plus 1 (WRITET_P1) instruction increments pointer 710 by 1. The select signal selects a "+1" output from register 712. Adder 711 adds this "+1" to the current value of pointer 710 and stores the incremented value in pointer 710. The Write Transpose Minus 1 (WRITET_N1) instruction decrements pointer 710 by 1. The select signal selects a "−1" output from register 712. Adder 711 adds this "−1" to the current value of pointer 710 and stores the decremented value in pointer 710. Following reset, updates to pointer 710 occur only after first issuing a WRITET_0 instruction. There are corresponding read transpose instructions Read Transpose (READT), Read Transpose 0 (READT_0), Read Transpose Plus 1 (READT_P1) and Read Transpose Minus 1 (READT_N1). Table 2 summarizes the update action of the 8 new instructions.

TABLE 2

| Nemonic | Action | Pointer Update |
|---|---|---|
| WRITET | Write | none |
| WRITET_0 | Write | reset to 0 |
| WRITET_P1 | Write | increment |
| WRITET_N1 | Write | decrement |
| READT | Read | none |
| READT_0 | Read | reset to 0 |
| READT_P1 | Read | increment |
| READT_N1 | Read | decrement |

The read transpose instructions are similar to the write transpose instructions. Updates to pointer 710 would not happen until a READT_0 is issued. Note that separate read and write pointers may be implemented.

A 2-bit PACT register controls clock gating to pBIST 130. PACT[0] controls pBIST unit 130 clocks. This bit needs to be set ("1") in order to turn on internal pBIST clocks. Setting this bit asserts an internal signal that is used as the clock gate enable. As long as this bit is a "0:, no access to pBIST unit 130 goes through and pBIST unit 130 remains in an almost zero-power state. PACT[1] controls pBIST ROM 131 clocks. This bit needs to be set "0" during normal operation. Setting this bit to "1" turns on the clock going to the instruction ROM. This bit enables a test designer to a RAM instead of pBIST ROM 131. In such cases, there is a need to have pBIST ROM 131 clocks running at the beginning to load the desired ROM contents into a substitute RAM through an available external interface like JTAG. Following this loading, the pBIST ROM 131 clocks can be shut off to save power.

A 2-bit override register can become extremely useful in product testing. OVERRIDE[0] is the RINFO Override bit. While doing pBIST ROM 131 based testing, each algorithm downloaded from pBIST ROM 131 has an associated memory mask that defines what memory groups this algorithm would be run on. By default, this bit is set to "1". In this state the memory mask downloaded from pBIST ROM 131 overwrites an internal RINFO register in other data registers 224. This internal RINFO register determine whether to decide run this algorithm on pre-defined memory groups. If OVERRIDE[0] is "0", the write enable for the downloaded memory mask is ignored and the internal register would not be overwritten. This gives the programmer the ability to define his own memory mask post-silicon and run pBIST ROM 131 based testing only on select memories. OVERRIDE[1] is the READ Override bit. By default, this bit is "0". In this state READ commands would be executed. If OVERRIDE[1] is "1", all READs are internally converted to READ without Compares. This provides the test designer the ability to program burn-in kind of tests which stress the memories without monitoring failures.

What is claimed is:

1. An integrated circuit comprising:
a plurality of operational circuits to be tested;
a test read only memory storing at least one test set consisting of a test algorithm and test data; and
a programmable built-in self test unit connected to said plurality of operational circuits to be tested and said test read only memory, said programmable built-in self test unit including
a plurality of memory mapped readable/writable test data read/write registers, and
a plurality memory mapped readable/writable test algorithm read/write registers; and
said programmable built-in self test unit operable to:
load from said test read only memory operable for each test set stored in said test read only memory one of (1) both said test algorithm and said test data, (2) only said test algorithm, and (3) only said test data,
test at least one of said plurality of operational circuits to be tested according to said test algorithm and/or said test data loaded by
storing selectively loaded test data in said test data read/write registers,
storing selectively loaded test algorithms in said test algorithm read/write registers,
loading said test algorithm from said test read only memory into said test algorithm read/write registers and loading said test data from said test read only memory into said test data read/write registers,
loading said test algorithm from said test read only memory and loading said test data read/write registers via a memory mapped write operation,
loading said test algorithm read/write registers via a memory mapped write operation and loading said test data from said test read only memory into said test data read/write registers, and
testing said at least one of said plurality of operational circuits to be tested according to an algorithm stored in said test algorithm read/write registers and data stored in said test data read/write registers.

2. An integrated circuit comprising:
a plurality of operational circuits to be tested;
a test read only memory storing at least one test set consisting of a test algorithm and test data; and
a programmable built-in self test unit connected to said plurality of operational circuits to be tested and said test read only memory, said programmable built-in self test unit including a configuration register having an algorithm bit and a data bit, said programmable built-in self test unit operable to
load from said test read only memory operable for each test set stored in said test read only memory one of (1) both said test algorithm and said test data, (2) only said test algorithm, and (3) only said test data,
test at least one of said plurality of operational circuits to be tested according to said test algorithm and/or said test data loaded,
load said test algorithm for a current test set from said test read only memory if said algorithm bit has a first digital state,
not load said test algorithm for a current test set from said test read only memory if said algorithm bit has a second digital state opposite to said first digital state,
load said test data for a current test set from said test read only memory if said data bit has said first digital state, and
not load said test data for a current test set from said test read only memory if said data bit has said second digital state.

3. The integrated circuit of claim 2, wherein:
said configuration register including said algorithm bit and said data bit is memory mapped readable/writable.

4. An integrated circuit comprising:
a plurality of operational circuits to be tested;
a test read only memory storing at least one test set consisting of a test algorithm and test data; and
a programmable built-in self test unit connected to said plurality of operational circuits to be tested and said test read only memory, said programmable built-in self test unit includes a configuration register having one bit corresponding to each possible test set stored in said test read only memory; and
said programmable built-in self test unit is operable to
load from said test read only memory operable for each test set stored in said test read only memory one of (1) both said test algorithm and said test data, (2) only said test algorithm, and (3) only said test data,
test at least one of said plurality of operational circuits to be tested according to said test algorithm and/or said test data loaded,
test said at least one of said plurality of operational circuits to be tested according to a test set stored in said test read only memory if said corresponding bit in said configuration register has a first digital state, and
not test said at least one of said plurality of operational circuits to be tested according to a test set stored in said test read only memory if said corresponding bit in said configuration register has a second digital state opposite to said first digital state.

5. The integrated circuit of claim 4, wherein:
said configuration register including said bit corresponding to each possible test set stored in said test read only memory is memory mapped readable/writable.

* * * * *